United States Patent [19]

Osterwold

[11] 4,227,030
[45] Oct. 7, 1980

[54] ARC FURNACE ELECTRODE SLIP MONITORING DEVICE

[75] Inventor: Heinz W. H. Osterwold, Roodepoort, South Africa

[73] Assignee: National Institute for Metallurgy, Randburg, South Africa

[21] Appl. No.: 53,553

[22] Filed: Jun. 29, 1979

[30] Foreign Application Priority Data

Jul. 14, 1978 [ZA] South Africa .................. 78/4025

[51] Int. Cl.² ............................................. H05B 7/10
[52] U.S. Cl. .................................................... 13/14
[58] Field of Search .................. 13/1, 9 R, 14, 15, 16, 13/17, 13, 12

[56] References Cited

U.S. PATENT DOCUMENTS

| | | | |
|---|---|---|---|
| 1,957,064 | 5/1934 | Hopkins | 13/13 UX |
| 2,297,484 | 9/1942 | Lehrer et al. | 13/16 X |
| 2,896,003 | 7/1959 | Eaton | 13/14 |
| 3,823,243 | 7/1974 | Vitale et al. | 13/13 |

Primary Examiner—Roy N. Envall, Jr.
Attorney, Agent, or Firm—Cushman, Darby & Cushman

[57] ABSTRACT

An arc furnace electrode slip monitoring device comprising a frame-work adapted to be held fixed relative to a movable electrode, a movable unit supported by the frame-work and movable in reciprocating manner along a predetermined path which is substantially parallel to the direction of movement of an electrode. An electrode engaging member is provided in the movable unit movable transverse to the direction of movement of the movable unit to firmly engage an electrode during movement of the movable unit in one direction but to be disengaged therefrom during movement in the opposite direction. The slip monitoring device further includes detecting apparatus for detecting the position of the movable unit along its path of movement, and further apparatus for counting the number of reciprocal movements executed by the movable unit.

9 Claims, 4 Drawing Figures

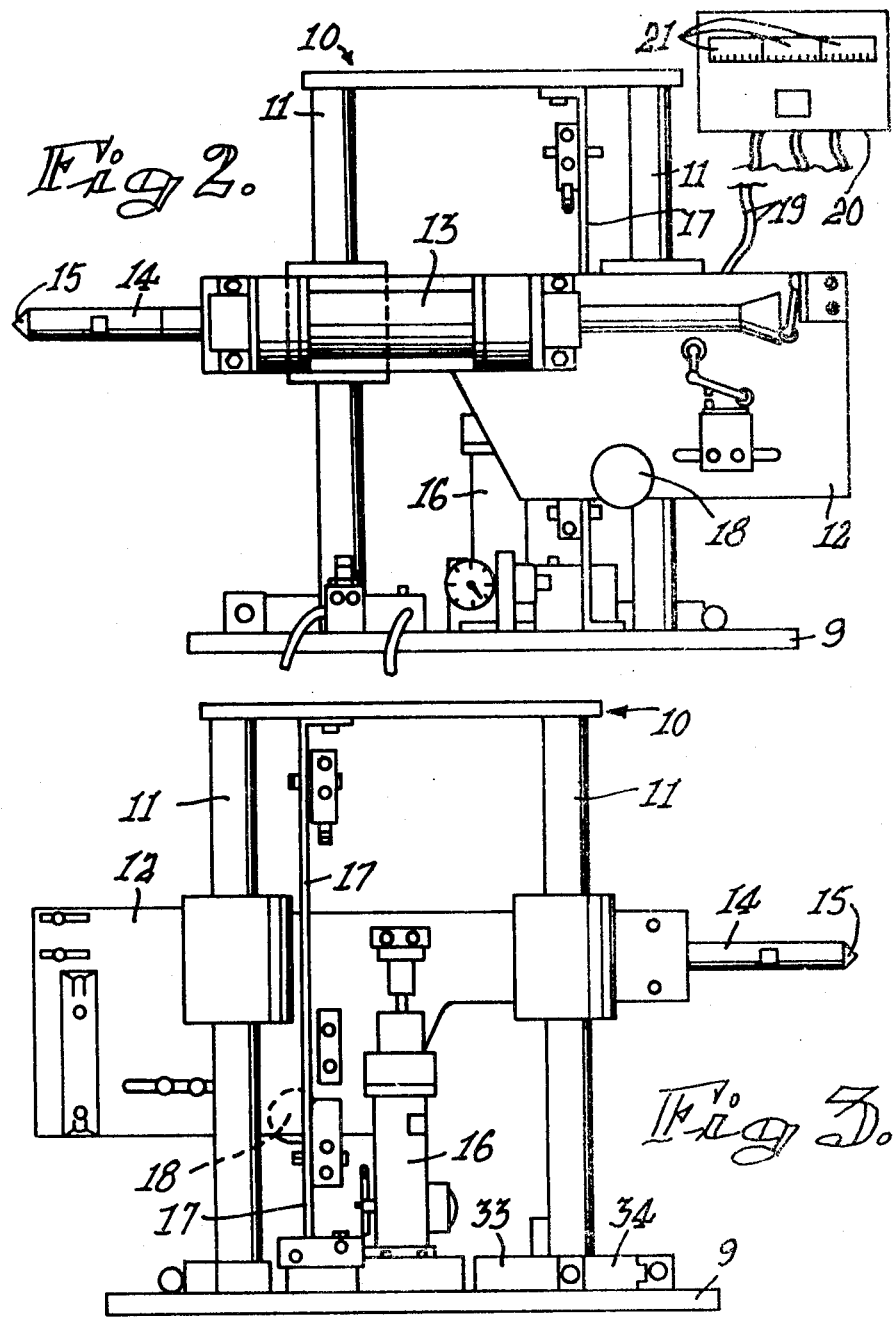

ARC FURNACE ELECTRODE SLIP MONITORING DEVICE

THIS INVENTION relates to an arc furnace electrode slip monitoring device for monitoring and recording the amount by which an electrode is slipped during operation and control of an arc furnace.

It is common practice in the operation and control of electric arc furnaces to measure the slip of an electrode manually. Such slip includes two types of slip namely, controlled slip which is promoted directly by the slipping device holding the electrode, and uncontrolled slip which is caused by the electrode moving or creeping downwardly relative to the slipping device. It is thus essential, in order to monitor the total slip of an electrode, to measure the movement of the electrode itself rather than the movement of a slipping device or part thereof. Devices have been proposed for the purpose of automatically monitoring and recording the amount by which an electrode is slipped but, as far as Applicant is aware, none of such devices have operated effectively.

One of such devices proposed to utilise a wheel urged into frictional contact with the electrode itself and wherein micro-switches were operated by the wheel as it rotated. However, due to the bad environment, namely, the presence of heat, dust, and failure of the micro-switches, as well as vibration of the electrode and difficulties in keeping the wheel in steady firm contact with the electrode casing, such device proved to be unsatisfactory.

It is considered important for a proper knowledge of the total amount of slip to be obtained so that baking-in of electrodes can be properly effected and excessive distances of slip in a certain period of time can be avoided.

It is the object of this invention to provide a slip monitoring device which will operate effectively in use and will not suffer from the disadvantages experienced heretofore.

In accordance with this invention there is provided an arc furnace electrode slip monitoring device comprising a frame-work adapted to be held relative to a movable electrode, a movable unit supported by said frame-work and movable in reciprocating manner along a predetermined path which is substantially parallel to the direction of movement of an electrode, an electrode engaging member movable transverse to the direction of movement of the movable unit to be capable in use of firmly engaging an electrode during movement of the movable unit in one direction but to be disengaged therefrom during movement in the opposite direction, means for detecting the position of the movable unit along its path of movement, and further means for counting the number of reciprocal movements executed by the movable unit.

Further features of the invention provide for the movable unit to be adapted to be free to move in unison with an electrode when the electrode engaging member is positively engaged with an electrode, for the electrode engaging member to be pointed at its electrode engaging end, for the electrode engaging member to be movable by means of a pneumatic piston and cylinder assembly mounted on the movable unit, for the device to embody a pneumatic piston and cylinder assembly for moving the movable unit relative to the frame in a direction opposite that in which an electrode moves, and for the device to be made in two parts, one of which carries the movable unit and is adapted to be located near an electrode, and a second part being the display and/or recorder unit adapted to be mounted some distance from the electrode.

Still further features of the invention provide for the means for detecting the position of the movable unit along its path of movement to be a potentiometer of the circular type fixed to the movable unit and having a pinion gear engaging a rack fixed relative to the frame work itself, for the potentiometer output voltage to be converted by suitable electrical means to an output giving an indication of the position of the movable unit in its path of travel, and for said means for counting the number of reciprocal movements of the movable unit to be an electro-mechanical counter.

The whole device is preferably operated purely by means of pneumatic piston and cylinder assemblies, suitable control valves therefor, and an electrical circuit. The further features and construction of the slip monitoring device will become more apparent from the following description of one non-limiting embodiment of the invention.

In the following description reference will be made to the accompanying drawings in which:

FIGS. 2 & 3 are front and rear elevations of a slip monitoring device according to this invention but without the pneumatic pipes in position; and, FIG. 4 is a pneumatic flow diagram of the slip monitoring device.

Figure 1:
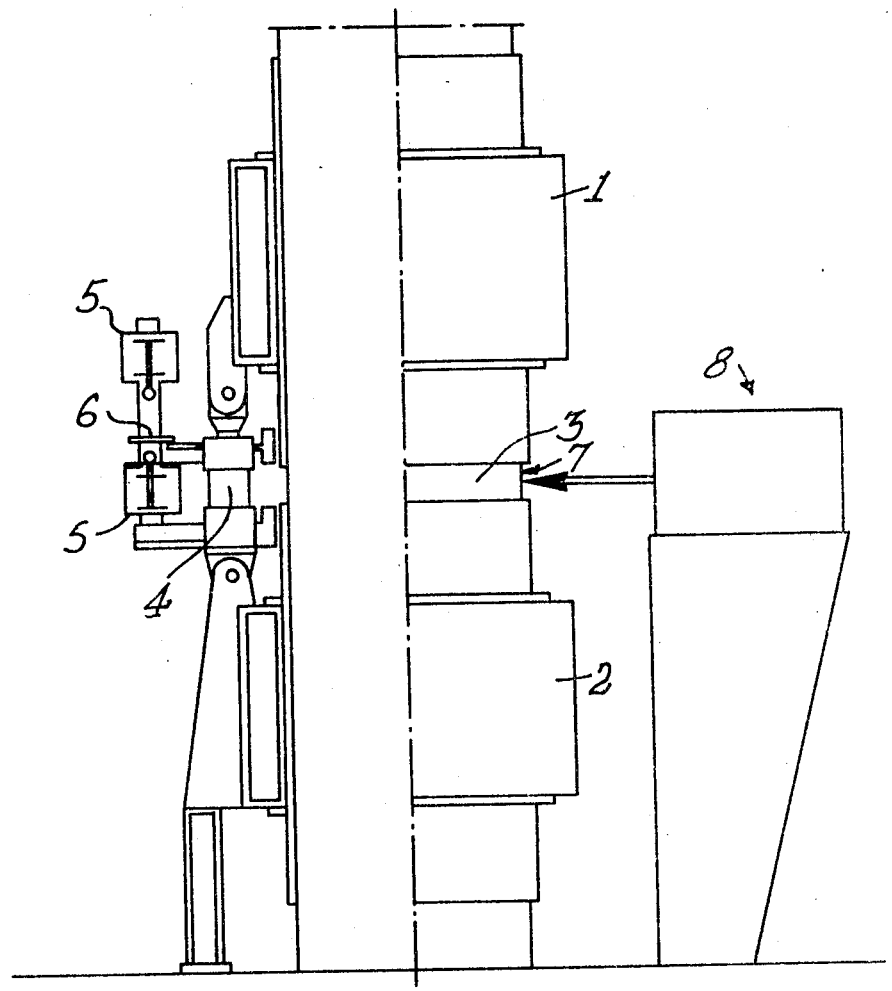
FIG. 1 is a schematic, partly sectioned, elevation of a slipping device for an electrode.

Simply for the sake of clarity, an electrode slipping device is illustrated in FIG. 1 wherein the device consists basically of a pair of clamping rings 1 and 2 located in spaced relationship to each other co-axially with the electrode 3. The upper ring 1, in this case, is movable in reciprocable manner by means of an hydraulic piston and cylinder assembly 4. The clamping rings operate on pneumatic pressure fed to the interior thereof in the usual way. The movement of the upper clamping ring 1 is limited between two extreme positions at which limit switches 5 are adapted to be operated by a member 6 attached fixed relative to the upper clamping ring so that movement thereof outside of these extremes is not permitted. Only a small space, generally of the order of ten or fifteen centimeters, is provided between the two clamping rings, this distance being indicated by numeral 7 in FIG. 1. It is in this region of the exposed surface of the electrode casing that the slip monitoring device, generally indicated by numeral 8, according to this invention is applied.

As is well known in the art the electrode is moved downwardly into a furnace by initially clamping the upper ring 1 and releasing the lower ring 2 and thereafter contracting the hydraulic piston and cylinder assembly 4 to move the electrode downwardly. When the upper clamping ring 1 reaches its lowermost limit of operation the lower limit switch is activated and the lower ring is clamped. The upper ring may then be unclamped and moved upwardly to its uppermost extreme to start another cycle of movement.

Referring now to FIGS. 2 and 3 of the drawings the device according to this invention comprises a base 9 supporting a frame 10 and adapted to be fixed relative to the lower clamping ring mentioned above and as shown in FIG. 1. The frame has a pair of spaced vertical guides 11 which support a vertically movable unit 12. Vertical movement of the unit 12 is limited to a predetermined distance and the unit can move on its guides in reciprocating manner between limits imposed on this movement.

Mounted on the movable unit 12 is a pneumatic piston and cylinder assembly 13 the axis of which extends at right angles to the direction of movement of the unit. The piston rod 14 is provided at its outermost end, which projects out of the side of the apparatus, with a sharpened point 15 for engaging an electrode.

A second pneumatic piston and cylinder assembly 16 is provided for moving the movable unit vertically upwards to its uppermost extreme limit of movement. During movement of the unit in the opposite direction, the said pneumatic piston and cylinder assembly 16 is disengaged therefrom to allow for free movement of the unit which will, when the point is properly engaged with an electrode, move in unison with the electrode.

A toothed rack 17 co-operates with a pinion connected to move the wiper of a circular type of potentiometer 18 fixed on the movable unit. Thus, the readings obtained from the potentiometer will be an indication of the position of the movable unit in its limited path of travel.

Preferably, the path of travel is fixed at a suitable distance such as, for example, 10 centimeters so that multiples of this distance can easily be assessed to indicate a total distance travelled by the electrode.

The potentiometer is fed with a d.c. voltage supply and the wiper of the potentiometer is fed through suitable leads 19 to a separate indicating and recording unit 20 which may be located some distance away, for example, in a control room. The indicator and recorded unit embodies the circuitry for indicating the total amount of slip which has occurred during any required period of time at the beginning of which the unit was set to zero. To this end, digital displays 21 may be used which reflect the total amount of slip sensed by both the number of cycles completed and the position in a current cycle for each of three or more electrodes of a furnace.

It will be understood that the outputs providing information as to the slip of an electrode can be fed, in suitable form, to a controller device or a computer which activates the device. The outputs may thus be utilised to activate warning means when excessive slip has occurred or the rate of slip has exceeded a certain maximum rate.

Figure 4:
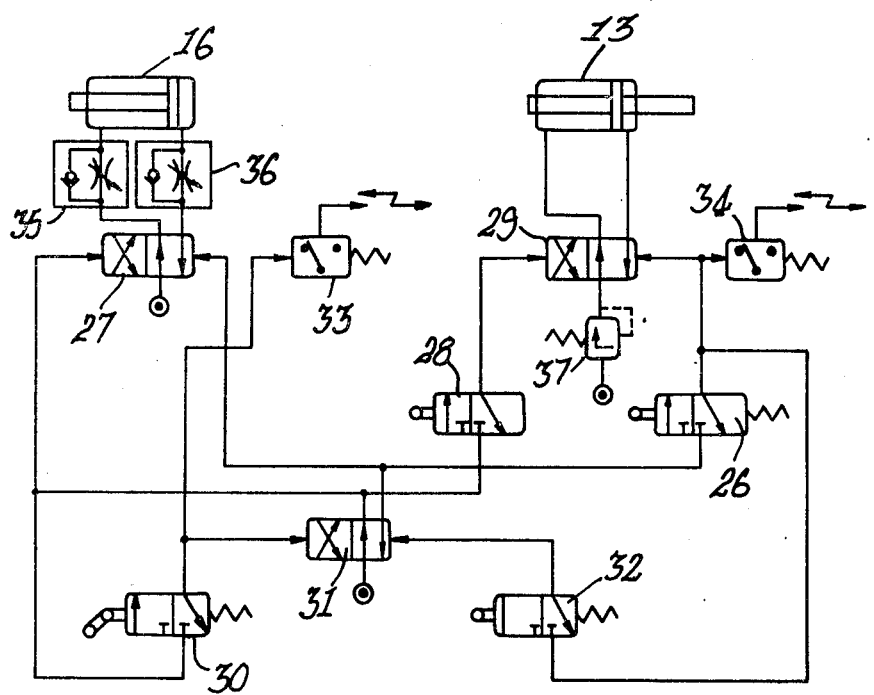

Further details of the frame and its associated unit which is fixed relative to the stationary clamp 2 will be best understood from a description of the pneumatic circuit of the device with particular reference to FIG. 4. The two double acting piston and cylinder assemblies 13 and 16 are operated through three pilot valves and suitably arranged limit switches to control their movement. For ease of description the pneumatic circuit will be described with reference to the cycle of operations to be performed on the movable unit 12 regarding the starting position as the position in which the unit is lowermost and the point 15 on the piston rod 14 of the pneumatic piston and cylinder 13 mounted on the movable unit in its retracted position.

In this position a limit switch 26 is operated which, through the one pilot control valve 27 operates the piston and cylinder assembly 16 for moving the movable unit 12. The movable unit is thus moved upwardly until such time as a separate limit switch 28 is operated which, in turn, through a second pilot valve 29, operates the horizontal piston and cylinder assembly 13 on the movable unit. The forward movement of the piston and cylinder assembly 13 is controlled by a limit switch 30 which, once the piston has made contact with the electrode, causes a pulse signal to be fed to a further control valve 31 which in turn reverses the control valve 27 which was originally promoting the upward movement of the movable unit.

Thereupon, the vertically movable piston and cylinder assembly 16 promoting the movement of the movable unit retracts to its unextended condition since the movement of the movable unit is, at this stage, governed by movement of the electrode. When the movable unit reaches the bottom of its path of movement the limit switch 26 is again operated which causes the cycle to be repeated. In so doing, the horizontal piston and cylinder assembly on the movable unit is retracted which closes a limit switch 32 to enable the cycle to again start.

The pilot control valves mentioned above are all switched over by alternate positive pressure pulses and even after the signal has been removed, they retain their assumed switched positions until the next pulse is received. Also, two signal convertors have been incorporated in order to connect the pneumatic and electric parts of the control system, these convertors being indicated by numerals 33 and 34 in FIG. 4. The flow rate of air to the pneumatic cylinder effecting movement of the movable unit is controlled through two regulating valves 35 and 36 to control the speed of movement of the movable unit.

A pressure reducer valve 37 is also preferably included in the supply to the piston and cylinder assembly 13 on the movable unit in order to control the impact force of the pointed end 15 of the piston rod 14 with an electrode. This valve also maintains the operating pressure at a substantially constant level so that the pointed end of the piston rod 14 id maintained in constant positive engagement with the side of an electrode in use.

The operation of the device will be quite clear from the above and no further description will be included herein.

The frame and movable unit described above is enclosed with suitable walls (not shown) and heat insulating material is preferably applied to such walls.

It will be understood that numerous variations may be made to the above described embodiment of the invention without departing from the scope hereof. In particular, the exact mechanical arrangement can be varied widely and the pneumatic control circuit can also be varied and, in fact, replaced by other suitable means for achieving the desired objective.

In field trials conducted thus far the device described above has operated effectively and proved to be accurate and reliable. However, as will be clear to those skilled in the art, there will be an error where the electrode slips whilst the pointed end 15 of the piston rod 14 is disengaged from the electrode in order to enable it to return to the start of a cycle. This problem could lead to an error of about two or three millimeters per cycle where the electrode is being slipped at the time when the movable unit starts another cycle. Such an error may be acceptable in which case no corrective measures need be taken. However, in order to avoid such an error, a relay could be connected into the existing slipping control device to prevent the electrode being slipped whilst the movable unit positions itself to start another cycle with the pointed end 15 of the piston rod 14 engaged with the electrode. Alternatively two movable units could be provided to move out of phase such that immediately one disengages the electrode the other one engages same.

What I claim as new and desire to secure by Letters Patent is:

1. An arc furnace electrode slip monitoring device comprising a frame-work adapted to be held fixed relative to a movable electrode a movable unit supported by said frame-work and movable in reciprocating manner along a predetermined path which is substantially parallel to the direction of movement of an electrode, an electrode engaging member movable transverse to the direction of movement of the movable unit to be capable, in use, of firmly engaging an electrode during movement of the movable unit in one direction but to be disengaged therefrom during movement in the opposite direction, means for detecting the position of the movable unit along its path of movement, and further means for counting the number of reciprocal movements executed by the movable unit.

2. A slip monitoring device as claimed in claim 1 in which the movable unit is adapted to move freely in unison with an electrode when the electrode engaging member is positively engaged with the electrode.

3. A slip monitoring device as claimed in claim 1 in which the electrode engaging member is pointed at its electrode engaging end.

4. A slip monitoring device as claimed in claim 1 in which the electrode engaging member is movable by means of a pneumatic piston and cylinder assembly mounted on the movable unit.

5. A slip monitoring device as claimed in claim 1 in which there is provided a pneumatic piston and cylinder assembly for moving the movable unit relative to the frame in a direction opposite that in which an electrode moves when slipping.

6. A slip monitoring device as claimed in claim 1 in which display means for providing a visual record of the distance moved by the movable unit is provided in a separate part adapted to be located at a remote position relative to the frame.

7. A slip monitoring device as claimed in claim 6 in which said separate part embodies electronic circuitry for maintaining a record of the total distance moved by the movable unit in the direction of electrode slipping.

8. A slip monitoring device as claimed in claim 6 in which the separate part has an output for connection to control means and which is dependant upon the distance moved by the movable unit in the direction of electrode slipping.

9. A slip monitoring device as claimed in claim 1 in which the means for detecting the position of movable unit along its path of movement is a potentiometer having a wiper with a position variable according to the movement of the movable unit.

* * * * *